United States Patent
Lemphers et al.

(10) Patent No.: US 9,679,296 B2
(45) Date of Patent: Jun. 13, 2017

(54) PROMOTION CODE VALIDATION APPARATUS AND METHOD

(75) Inventors: David Lemphers, Kirkland, WA (US); Christopher Couhault, Menlo Park, CA (US); Alexandros Suvacioglu, Menlo Park, CA (US)

(73) Assignee: RetailMeNot, Inc., Austin, TX (US)

( * ) Notice: Subject to any disclaimer, the term of this patent is extended or adjusted under 35 U.S.C. 154(b) by 130 days.

(21) Appl. No.: 13/307,586

(22) Filed: Nov. 30, 2011

(65) Prior Publication Data

US 2013/0138495 A1 May 30, 2013

(51) Int. Cl.
*G06Q 30/00* (2012.01)
*G06Q 30/02* (2012.01)

(52) U.S. Cl.
CPC ........ *G06Q 30/02* (2013.01); *G06Q 30/0207* (2013.01); *G06Q 30/0225* (2013.01); *G06Q 30/0222* (2013.01)

(58) Field of Classification Search
None
See application file for complete search history.

(56) References Cited

U.S. PATENT DOCUMENTS

| | | | | |
|---|---|---|---|---|
| 5,924,078 | A * | 7/1999 | Naftzger | 705/16 |
| 6,157,940 | A | 12/2000 | Marullo et al. | |
| 7,770,068 | B2 * | 8/2010 | Drees | 714/38.14 |
| 7,805,620 | B2 * | 9/2010 | Yang et al. | 713/300 |
| 7,912,214 | B2 | 3/2011 | Andre et al. | |
| 8,042,112 | B1 * | 10/2011 | Zhu et al. | 718/102 |
| 2004/0254836 | A1 * | 12/2004 | Emoke Barabas et al. | 705/14 |
| 2006/0276997 | A1 * | 12/2006 | Drees | 702/182 |
| 2008/0010561 | A1 * | 1/2008 | Bay et al. | 714/49 |
| 2008/0041950 | A1 * | 2/2008 | Michels | 235/419 |
| 2008/0267500 | A1 * | 10/2008 | Keswani et al. | 382/173 |
| 2008/0300973 | A1 * | 12/2008 | DeWitt et al. | 705/14 |
| 2009/0024472 | A1 * | 1/2009 | Andre et al. | 705/14 |
| 2009/0119620 | A1 * | 5/2009 | Jain | G06F 3/038 715/854 |
| 2010/0131835 | A1 * | 5/2010 | Kumar et al. | 715/205 |
| 2011/0196924 | A1 * | 8/2011 | Hargarten | G06Q 30/02 709/204 |
| 2012/0166267 | A1 * | 6/2012 | Beatty et al. | 705/14.21 |

OTHER PUBLICATIONS

International Search Report and Written Opinion for PCT/US12/67279, dated Feb. 20, 2013, 11 pages.

(Continued)

*Primary Examiner* — Stephanie Delich
(74) *Attorney, Agent, or Firm* — Pillsbury Winthrop Shaw Pittman LLP

(57) ABSTRACT

A method including interacting with a promotion code provider programmatically, providing a promotion code to a validation function of the promotion code provider, and evaluating a response from the promotion code provider. The act of interacting with a promotion code provider can include controlling an interface that simulates user actions, such as but not limited to controlling an in-memory web browser through an API, where the API provides a set of functions for simulating user actions. Accordingly, the method can be used to quickly and easily determine whether one or more promotion codes, such as online coupons, are valid.

19 Claims, 6 Drawing Sheets

(56) References Cited

OTHER PUBLICATIONS

European Search Report for EP 12181687, dated Mar. 7, 2013, 2 pages.
Har'El, Nadav, Harnessing the Power of the Web (Web Automation and Libwww-perl), Proceedings of YAPC Israel, Feb. 26, 2004, 13 pages.
Shchekotykhin, Kostyantyn, et al., "xCrawl: a high-recall crawling method for Web mining", Knowl. Inf. Syst., Nov. 18, 2009, vol. 25, No. 2, pp. 303-326.
Substantive Examination Report for EP12181687, dated Feb. 5, 2014, 8 pages.

* cited by examiner

PROMOTION CODE VALIDATION APPARATUS AND METHOD

FIELD OF THE INVENTION

This invention relates generally to the field of online shopping and customer discounts, such as through the use of promotion codes.

BACKGROUND

Today, internet shoppers have no way of knowing if an online coupon code or promotion code is valid. There are, for instance, various coupons, discount numbers, promotion codes, and the like that online shoppers can enter in a website to attempt to receive a discount when making an online purchase. These coupons, discount numbers, or promotion codes will generally be referred to as "promotion codes." Typically, shoppers have to test the validity of promotion codes at checkout to see if a retailer will accept them. Reasons for a retailer not accepting a promotion code include, but are not limited to, the following:

(1) the promotion code has expired (its applicable date has passed);

(2) the promotion code cannot be applied to the current shopping basket (e.g. price of items in basket is insufficient for the discount, promotion code applies to a different product than that selected in basket);

(3) the promotion code cannot be redeemed due to the user's profile (location, etc. . . . ); or (4) the promotion code has been deactivated by retailer.

The typical way to validate a promotion code, therefore, involves the manual validation of the promotion code by the online shopper during the shopping process. This requires every internet shopper to perform the following steps:

(1) visit the retailer they want to make a purchase from;

(2) add one of the products they want to buy to the shopping cart;

(3) get to the checkout page;

(4) open a new browser tab, and find a promotion code for that retailer;

(5) go back to the retailer's website and apply the promotion code to test whether it is valid; and (6) repeat from step 4, until the online shopper purchases the item after finding (or not finding) a promotion code he/she is satisfied with or does not make a purchase and abandons the shopping cart.

Put simply, online shoppers have no way of knowing a promotion code's validity without painstakingly performing the manual steps outline above.

SUMMARY OF INVENTION

According to one embodiment, a method of the invention includes interacting with a promotion code provider programmatically, providing a promotion code to a validation function of the promotion code provider, and evaluating a response from the promotion code provider. The act of interacting with a promotion code provider can include, for example, controlling an interface that simulates user actions, such as but not limited to controlling an in-memory web browser through an API, where the API provides a set of functions for simulating user actions. The act of interacting with a promotion code provider can include navigating to a website of the promotion code provider to a location where a promotion code can be tested. Further, the step of evaluating a response from the promotion code provider can include, for example, determining whether the promotion code is valid. Accordingly, the method can be used to determine whether a promotion code, such as an online coupon, is valid.

Another embodiment of the invention is a computer-readable storage media embodying logic that is operable when executed to perform a series of steps. These steps include interacting with a promotion code provider programmatically, providing a promotion code to a validation function of the promotion code provider, and evaluating a response from the promotion code provider.

Yet another embodiment of the invention is an apparatus that includes at least one driver module, wherein the driver module is operable to control an interface that simulates user actions. The apparatus also includes a monitor to manage the at least one driver. In addition, the driver module contains logic that is operable when executed to: (a) provide a promotion code to a validation function of the promotion code provider and (b) evaluate a response from the promotion code provider. In use, the apparatus can be used to determine whether a promotion code, such as an online coupon, is valid.

BRIEF DESCRIPTION OF THE DRAWINGS

The invention is illustrated in the figures of the accompanying drawings which are meant to be exemplary and not limiting, in which like references are intended to refer to like or corresponding part, and in which.

DETAILED DESCRIPTION

Figure 1:
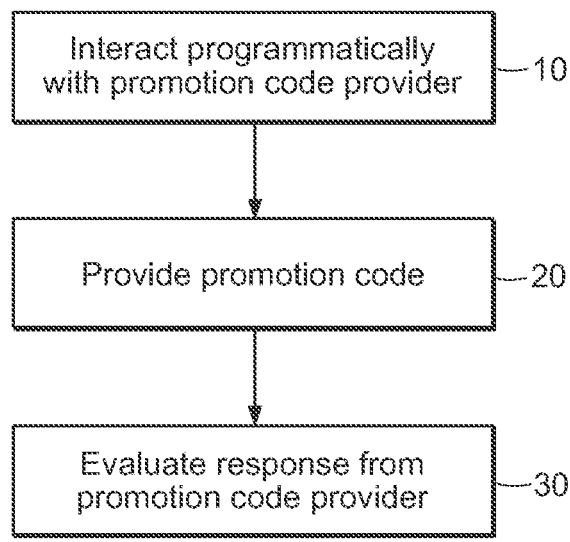
FIG. 1 is a flow diagram of a method that can be used to validate one or more promotion codes according to a preferred embodiment of the disclosed subject matter.

To address the need set forth above, according to one aspect, the invention includes a method and apparatus that can automatically validate one or more promotion codes. FIG. 1 is a flow chart that illustrates the operation of the invention in one embodiment. As set forth in FIG. 1, block 10 is an act of interacting with a promotion code provider programmatically. This means, for example, using a recursive process to determine where to go on a retailer's website to enter a promotion code. Programmatic interaction within this context can be the act of communicating with a promotion code provider through a particular set of instructions exposed through technology interfaces, such as software or hardware. The interaction may occur through a variety of mediums, such as a web interface, mobile interface, wire protocol, or shared data store such as a queue or similar construct. The method of interaction may occur through software or hardware, so it can be language independent, and may be initiated directly through the exposed interface or via a software development kit or bundled set of libraries. The interfaces may be provided directly by the provider, or through a third party, such as a hosting provider or software vendor. Next, at block 20, a promotion code is provided to a validation function of the promotion code provider. Finally, at block 30, the method evaluates a response from the promotion code provider. This evaluation can include, for example, determining whether the promotion code is valid. As such, this method allows for the automated validation of one or more promotion codes.

As used herein, the term "promotion code provider" can be one or both of a merchant or a source of a promotion code. The merchant, for example, could be a merchant or reseller that accepts promotion codes from third party sources. The source of a promotion code, for example, could be a third party that provides or accepts promotion codes for products and could include, for example, a product manufacturer or seller.

The present invention solves the problem of online shoppers spending time searching for and testing the validity of promotion codes. The invention can, for example, automatically test the validity of promotion codes and only deliver online shoppers promotion codes that a retailer will accept. This saves the user a significant amount of time because they no longer need to manually validate promotion codes.

The invention also solves problems for online merchants, which collectively experience high shopping cart abandonment rates, which decrease sales. Shopping cart abandonment refers to the loss of a customer who is going through the check-out process of an online transaction.

Because much of online shopping is impulse driven, there is a higher probability that the online shopper will abandon the shopping cart with every additional second that the online shopper does not make a purchase. Over half of all online shoppers use promotion codes, and the searching and testing of these promotion codes increases the time they spend going through the purchase process and thus results in higher shopping cart abandonment. The invention saves the online shopper a significant amount of time by automatically testing the validity of promotion codes, which helps to decrease the time online shoppers spend going through the purchase process, this decreasing abandonment rates.

Figure 2:
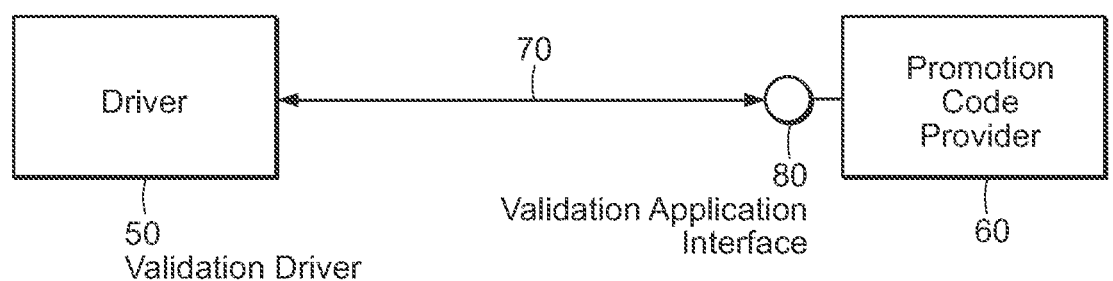
FIG. 2 is a block diagram showing the environment for use of the invention in one embodiment.

FIG. 2 shows the environment for use of the invention in one embodiment. FIG. 2 shows, for example, a driver 50 connected to a promotion code provider 60 through an interaction channel 70 for executing instructions and passing data to the promotion code provider 60. The driver 50 can be, for example, a program that executes a series of instructions. The promotion code provider 60 can be, for example, the website for an online merchant. The promotion code provider 60 includes a validation application interface 80, which is the interface such as a website page that allows a user to enter a promotion code.

Figure 3:
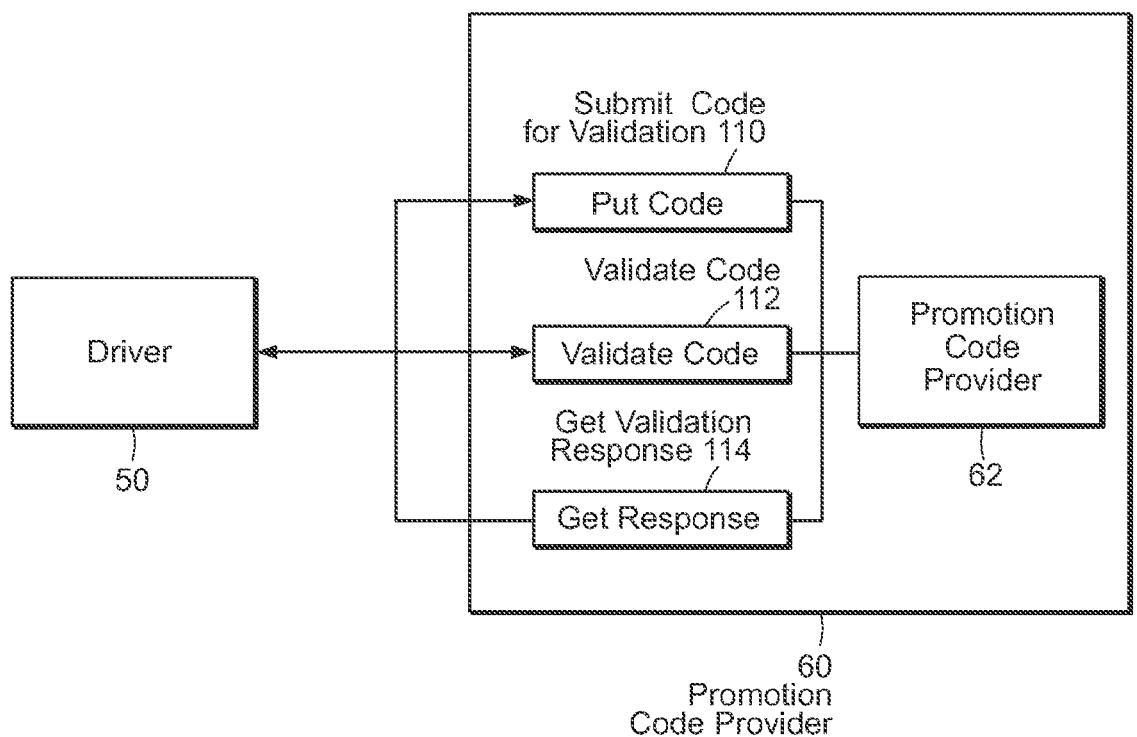
FIG. 3 is a block diagram that shows greater detail of the promotion code provider 60 shown in FIG. 2.

FIG. 3 shows greater detail of the promotion code provider 60 shown in FIG. 2. The promotion code provider 60 includes logic 62 to create web pages for display. FIG. 3 illustrates that the promotion code provider 60 includes put code 110, which allows the user to submit a promotion code for validation. For instance, the checkout page for many online merchants includes a user interface for entering and submitting a promotion code. The driver 50 interacts with this put code 110 programmatically to automatically validate a promotion code. The promotion code provider 60 also includes validate code 112, which is the promotion code provider's code that determines whether to accept a promotion code, whether it has expired, or whether there is some other issue with the promotion code that prevents its use. Finally, the promotion code provider 60 includes a get response function 114, which is the promotion code provider's mechanism to submit back to the driver 50 the result of whether the promotion code is valid. This get response function 114, for example, can include the provision of a message to the driver 50 that the promotion code has been accepted or that the promotion code has expired.

Figure 4:
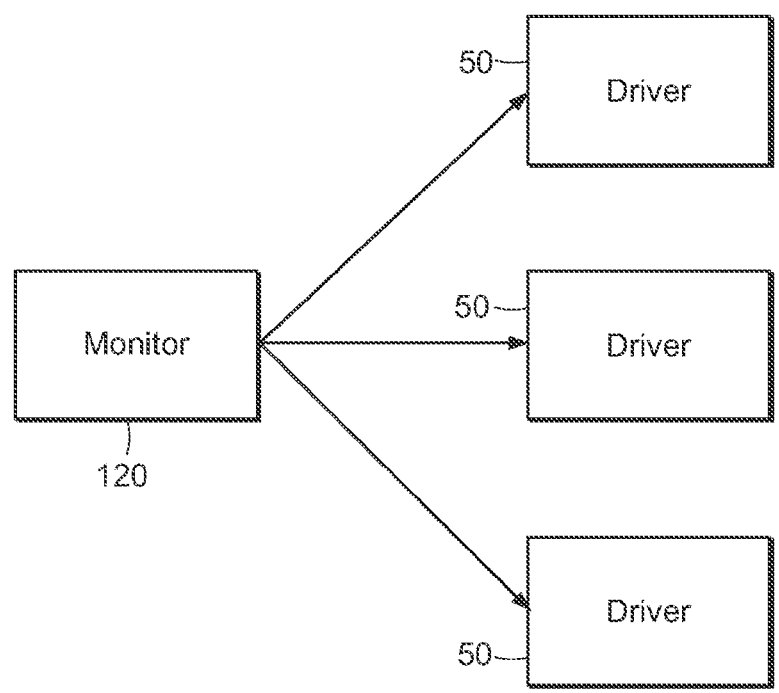
FIG. 4 is a block diagram of one embodiment of the invention.

FIG. 4 is a block diagram of one embodiment of the invention. In this embodiment, the invention consists of two main sub-systems, a driver 50 which is capable of interacting with a merchant's website, and a monitor 120, which is responsible for controlling the work queue of promotion codes to be validated. The monitor 120 can instantiate one or more drivers 50, depending on the volume and type of promotion codes to be validated. FIG. 4, for example, illustrates three such drivers 50, although the invention can scale up or down the number of drivers 50 depending on the promotion codes to be validated.

Figure 6:
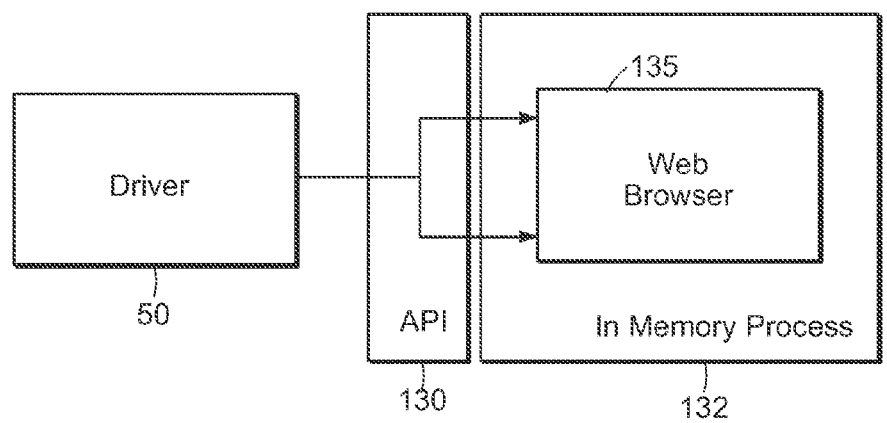
FIG. 6 is a block diagram that shows greater detail of the embodiment of FIG. 4.

Referring again to FIG. 4, the driver 50 can operate by controlling an in-memory web browser through an automation application programming interface (API). FIG. 6 illustrates this in more detail. In particular, the driver 50 uses an API 130 to control an in-memory process 132 including an in-memory web browser 135 than can be used for promotion code validation. The API 130 provides a set of functions through which the driver program simulates actions normally performed by an end user, such as an online shopper. The API 130 can include three main entry points: (1) the merchant discovery entry point; (2) the validation entry point; and (3) the configuration entry point. The caller can communicate with the API 130 through a REST based interface by selecting the function to execute and then specifying the merchant on which they want to execute the function against. The calling pattern, for example, can be as follows: http://api.shopply.com/{merchant}/{coupon}/validate. In this calling pattern, {merchant} and {coupon} are values provided to the API 130. The API 130 can respond by passing a JSON object containing the validation data back to the caller through the response's body. The API 130 can operate in both synchronous and asynchronous mode, which is determined by the caller when they submit the request.

Figure 7:
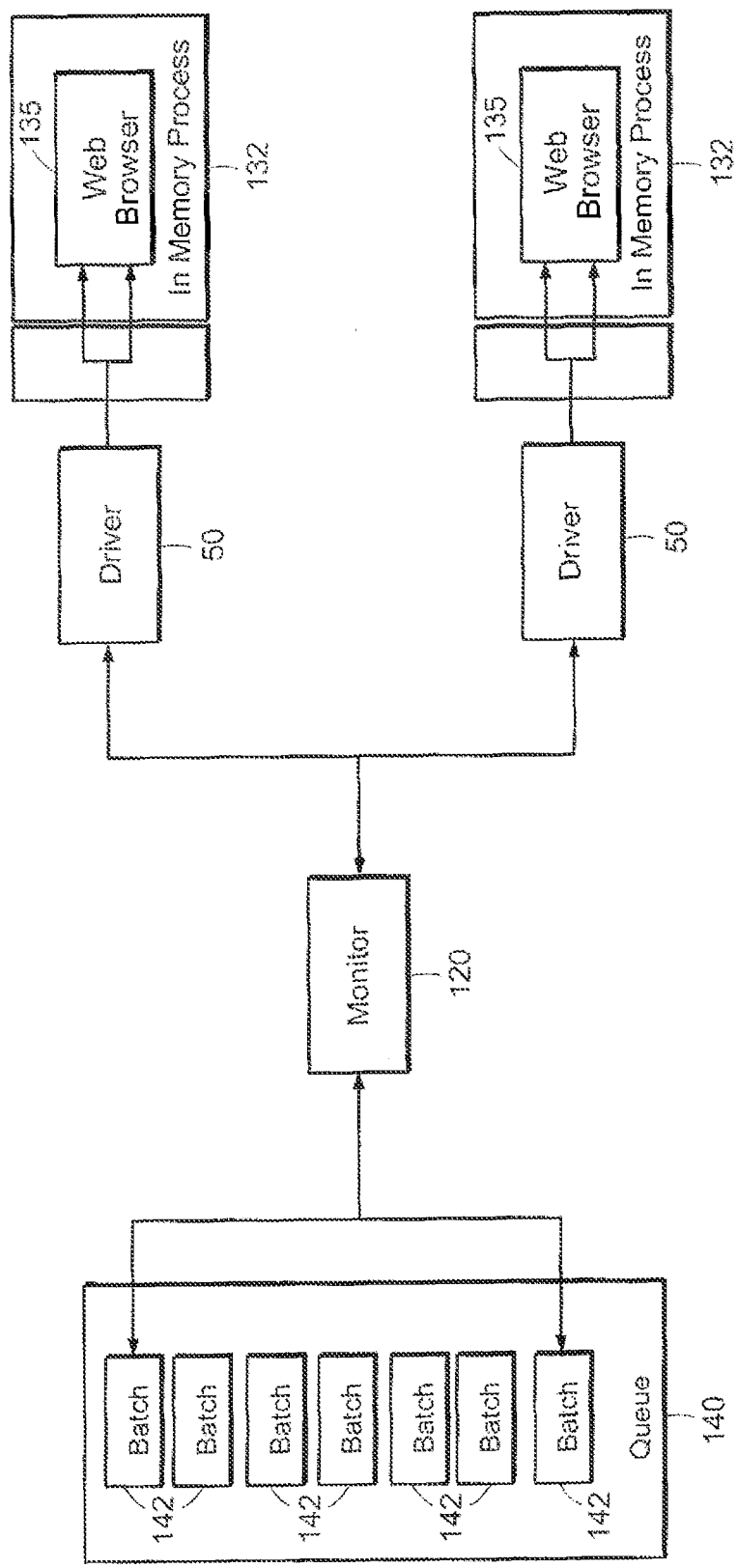
FIG. 7 is a block diagram that shows greater detail of the embodiment of FIG. 6.

Referring to FIGS. 4 and 7, the monitor 120 manages one to many drivers 50. The monitor 120 is connected to a work queue 140, which represents a set of batches 142 of promotion codes to be validated against a specific merchant. The monitor 120 can be based on a throttling pattern, and it can dynamically scale the number of drivers 50 being instantiated and operated based on a service level agreement (SLA) policy. FIG. 7, for example, shows two of the drivers 50 of FIG. 6, each controlling an in-memory web browser 135. The lifecycle of the monitor 120 involves checking the work queue 140 on a regular interval and establishing a count of how many promotion codes are ready for validation. The monitor 120 then examines the historical validation rate data (based on past attempts to validate promotion codes) to establish an optimal instance count by inspecting the SLA and identifying whether the current instance count multiplied by the mean time to validate per instance will meet the expected throughput for the SLA per merchant. The monitor 120 will then increase or reduce the number of instances of drivers 50 to ensure it can meet the SLA min and max performance boundaries.

Referring again to FIG. 1, the driver 50 can interact with a promotion code provider 60 programmatically. In such a manner, the driver 50 can determine where a promotion code validation page and location exists within a merchant's website. Doing so allows for the automated validation of one or more promotion codes.

Figure 8:
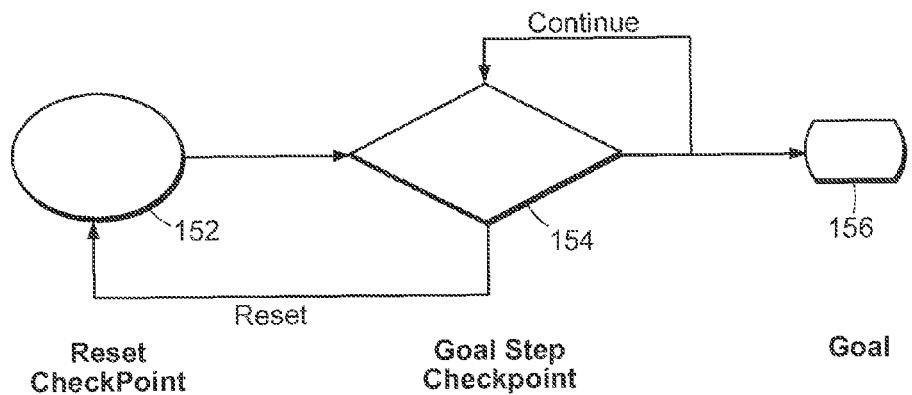
FIG. 8 is a block diagram that shows an evaluation of paths during the navigation of a website according to one embodiment of the invention.

FIG. 8 shows such a recursive process through which a driver programmatically interacts with a promotion code provider. FIG. 8 shows the use of a reset checkpoint 152 for resets, a checkpoint that determines whether the driver 50 needs to reset to restart the exploration, and a state of reach its goal 156—a promotion code entry page. To interact programmatically with a promotion code provider 60, each instantiated driver 50 starts at a well-known point, also known as the reset checkpoint 152. The purpose of the reset checkpoint 152 is to provide the driver 50 a known state from which to start its automation process. From the reset checkpoint 152, each driver 50 navigates the merchant website, selecting the appropriate path to its goal state 156, which is the page where a promotion code can be tested. If at any point in the process, the driver 50 does not understand its current environment, it returns to the reset checkpoint 152, and starts the exploration process.

As an example according to FIG. 8, the driver 50 will start at a known entry point, such as the root or home page of a promotion code provider 60, or root domain of the merchant, and then begin enumerating the possible exit elements of the page. As the driver 50 begins recursively exploring each exit path, it will check 154 if it is at its goal state (a page where a promotion code can be validated), or, if not, what the possible exit paths are that do not create a cyclic relationship. If, at some point, the driver 50 reaches a state where there are no exit paths, and there is no promotion code entry page, then it may determine that it is at an invalid state. The driver 50 may, for instance, determine that it is at an invalid state if it determines that some of the explorations have not completed successfully or have experienced an error. At this point, the driver 50 may restart by zeroing all recursions, going back to the start point, and restarting the exploration.

The overall exploration process is a set of Bayesian networks, where each node in the macro network is an individual page on a merchant website. Each network consists of one to many nodes with each node representing a web page on the site. The start node is the current page being explored and each outbound node represents a page destination accessible by an HTML element capable of navigation, such as an anchor or link. Over time, the driver 50 builds up a set of paths that describes a relationship between nodes where the conclusion of each path has been a successful promotion code page. When the driver 50 reaches a promotion code validation page, it takes each node in its traveled path and increments its score by the total distance traveled by the number of nodes traveled. Over time, nodes that prove to lead the driver 50 to a promotion code validation page will have the highest scores, helping the driver 50 establish a fast path to the promotion code validation page.

Figure 9:
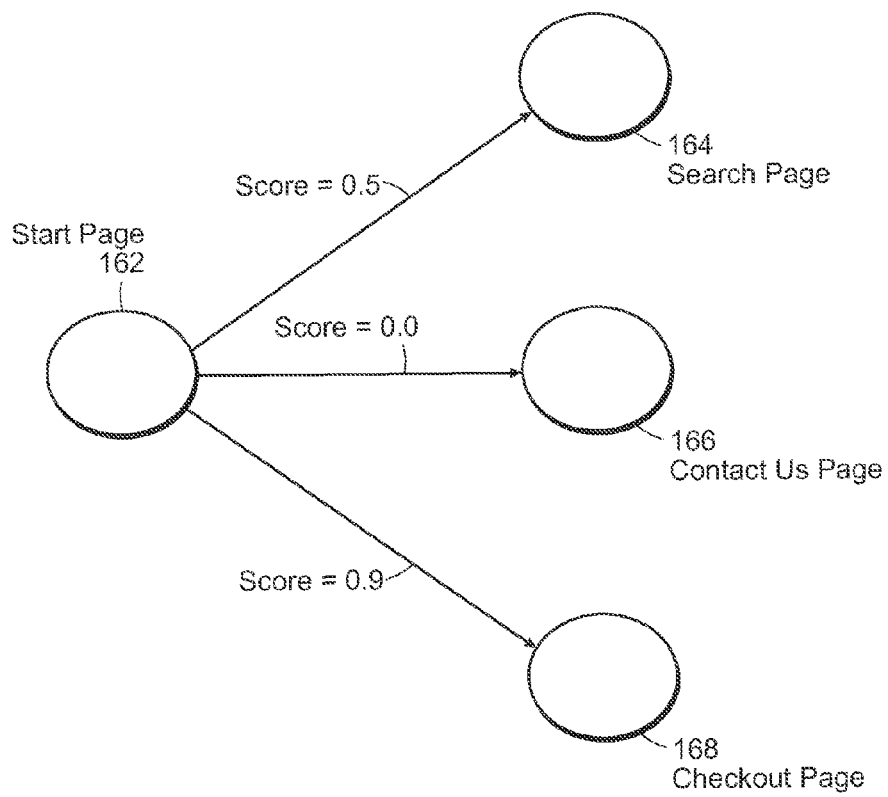
FIG. 9 shows the scoring of paths during the navigation of a website according to one embodiment of the invention.

FIG. 9 shows one such network. FIG. 9 shows, for instance, the score from a start page 162 to a search page 164 being 0.5, the score for a page for contact information 166 as a 0.0, and the score for a checkout page 168 being 0.9. Thus, the chances are the highest that the checkout page 168 will be a page where a promotion code can be entered, the search page 164 is the next most likely page where a promotion code can be entered, and the contact us page 166 is the least likely.

The scoring is based on historical data built up over time by the system. Each evaluation involves doing a depth first traversal using a shortest path algorithm such as Dijkstra or Bellman-Ford. The performance of this approach increases after each consecutive exploration by the magnitude of changed deltas in the site map since the last exploration. Each score represents the likelihood that the algorithm will find a page where a coupon validation function exists. This score is recorded at each edge between nodes, where each node is a web page in a site being explored, and each edge is a relationship between two pages formed by an element, such as a hyperlink. The score is determined by the algorithm during its traversal process, based on a set of rules. These rules measure the divergence potential of a page. For example, a page with four hyperlinks to pages within the site domain has a higher likelihood of leading the driver to a successful state than a page with two hyperlinks that link to pages outside of the sites domain. The basic principal of the scoring function is to find convergence within site pages towards a page that provides a validation function. In the instance where the provider publishes a programmatic interface, such as an application programming interface or API, then the scoring function will rank this highest because pages that provide some form of interface receive a higher score than non-programmatic interfaces, such as web pages.

When the driver 50 starts its exploration process, it begins at a root node, such as, for example, the start page 162 of a site as shown in FIG. 9. The driver 50 then creates a set of multiple recursion paths to explore. It determines the list of exit paths, and then selects each path and explores it. At each evolution, it establishes the exit paths, and picks the first one when it reaches an end state, such as either a promotion code entry page, a page with no exit paths, or an exit path to a page it has already visited. The driver 50 then ends its traversal and recurses back to the start. At this point, the next exit path from the root is selected and traversed to the end.

Each time the driver 50 recurses and traverses to an end state, it places a score against the graph edges that led to the end state, with higher scores being given to edges that led to a promotion code validation page, lower scores being assigned to pages that led to dead ends (no exit paths), and the lowest score being given to cyclic edges. FIG. 9, for example, shows exemplary scores for three traversals from a start page 162.

As an example, if the driver 50 starts at the home page, there may be four possible ways to exit the page—there might be 3 links and one input element. The driver 50 assembles these in a list, and then selects the first path, such as the first of the 3 links. It navigates that link and evaluates the destination. If the destination caused the driver 50 to leave the domain of the site, for example, from domainx.com to domainy.com, then the recursion terminates. If the destination is a page within the parent domain (including sub-domains), then the page is evaluated as potentially having a promotion code input box, an input control, or exit paths. If there are no exit paths and no promotion code input boxes or input controls, then the recursion terminates. If the page has exit paths, the algorithm recurses. If the destination has a promotion code control, the driver 50 records this and still exits, but does so by setting a flag to indicate success. Each root path is evaluated until a success is found or until all root paths have been explored.

Using the recursive traversal process set forth above allows the driver 50 to learn about various merchant web-sites and use that learning in the future. For instance, if a driver 50 has evaluated a particular merchant website in the past, the next time the driver 50 arrives at the same merchant site, it will look up the learning corpus from its path traversals, and if a prior successful path exists, it will validate this path. If the path succeeds, the driver 50 navigates it. If not, the driver will evaluate a new path in the manner set forth above.

For each node in the macro network, the invention can establish a micro network for all possible exit points. In exploring a web site and looking for a particular goal, it is important to have some basis for moving forward. Web pages have a finite set of possible exit points, because the published specification for HTML describes the possible controls that enable site navigation. Being able to determine how to move forward from a page helps the driver explore the site, making it possible to find the promotion code validation page and control. Without an exit point, it would be very difficult to understand how to discover the promotion code validation page in a methodical, efficient, programmatic manner. Each node in the micro graph represents an element on the page, where the edges represent meaningful relationships and scores.

Figure 10:
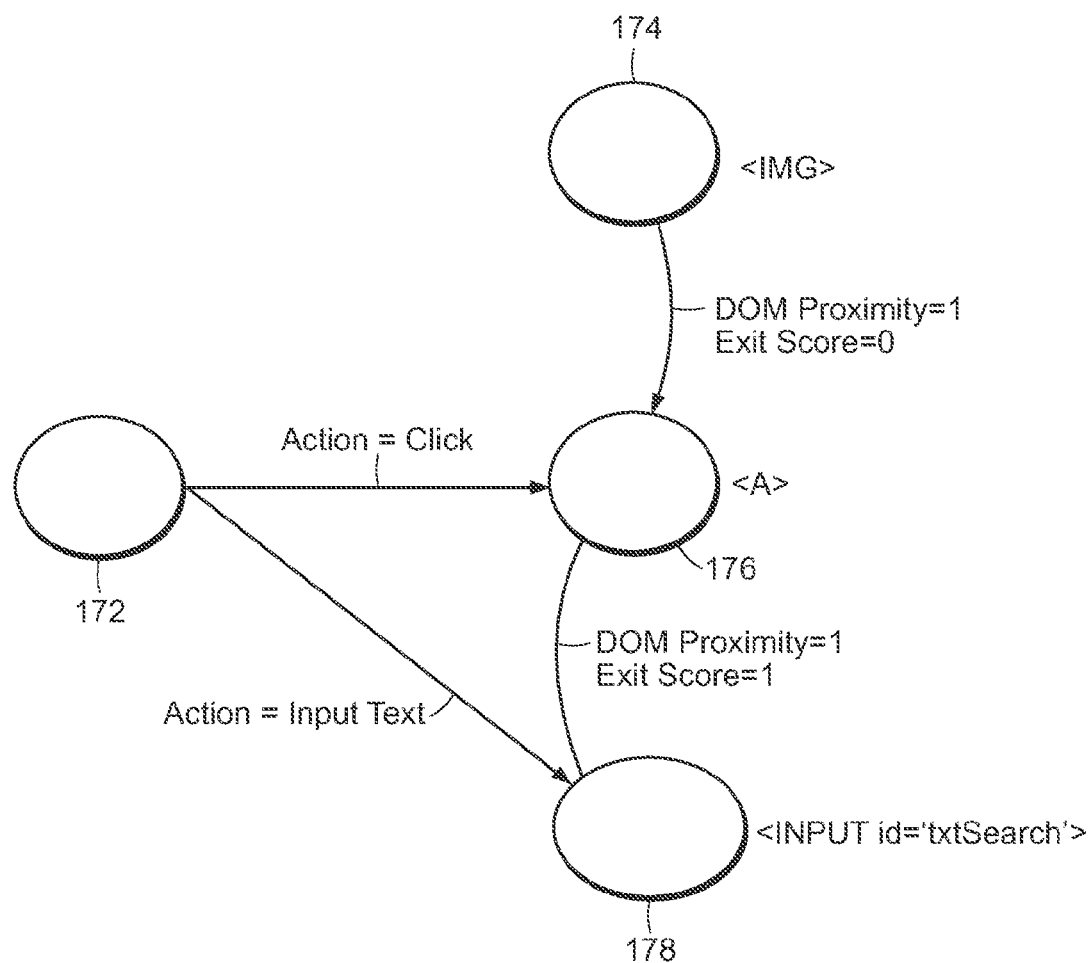
FIG. 10 is an example of what a driver 50 according to one embodiment of the invention will assemble and interpret at each page evaluation from a start node.

FIG. 10 is an example of what the driver 50 will assemble and interpret at each page evaluation from a start node 172. Each node represents an element on the page, for example, an image 174 or hyperlink 176. Some elements have potential actions, for example, an Anchor, also known as a hyperlink, that can be clicked or an input 178 that can have text entered into it. The start node 172 in FIG. 10 represents the driver 50 and the nodes 174, 176, 178 to the right represent elements that provide a potential exit point. Each node also has meta information associated with it. For example, the driver 50 will look for interaction elements, like links 176 or buttons, that have a close proximity to an input element, such as a text box 178 for inserting a promotion code. If an interaction element is in close proximity to an input element, this makes it more likely to be associated in some higher level concept, like a form. The DOM is the document object model, which is the graph/tree structure that underlies all web pages and describes the structure and relation of elements that make up the page.

There are two graphs stored within the system. The graphs can be stored either as adjacency matrices or lists, depending on the size of the site. The primary basis for the graphs is to describe relationships between web pages, or within a web page, relationships between elements. The data structure is laid out to provide efficient application of the search algorithm, where the union of two nodes provides information on scoring, proximity, etc. First, the site-level graph lays out the relationship between Web pages. For example, the home page links to the contact page. Second, the page-level graph shows the relationship of elements on the page. For example, on the home page, there are two hyperlinks and two images. Like the site-level graph, the page-level graphs are scored using historical metrics based on prior explorations, but are also weighed on change. The page DOM can be calculated based on elements, but not necessarily based on layout. Any change in the DOM score will require the page to be explored again.

Each element on the page is assessed on two attributes. The first attribute is its exit-ability, which is based on a finite set of known HTML elements. The second attribute is proximity to an exit-able element. The edges on the graph are based on actions, with implicit decision criteria, based on a forward-flow model where the system is always moving forward.

The primary benefit of using a combination of machine learning, graph theory, and automation, as explained above, is that any website that offers a user the ability to validate a promotion code can be explored by the system. Machine learning can help to optimize this process to run at scale, especially in relation to using learned routes and just-in-time evaluation of page changes. Graph theory can allow the system to simulate multiple explorations using a dynamic set of traversal and scoring algorithms, such as Dijkstra, Bellman-Ford, and a range of models such as generalized Voronoi graphs or frontier-based methods.

Referring again to FIG. 1, the system according to the invention provides a promotion code 20 to a validation function of the promotion code provider. After a promotion code entry page has been found, for example, according to the technique set forth above, promotion codes can be entered on the web page by the driver using an automation API. When a promotion code entry box is discovered, the driver 50 will set the text of the element to a promotion code, and the submit function of the page is invoked to execute the validation function of the web page. As such, the driver 50 is automated to enter promotion codes on the appropriate page and location of a merchant's website. The driver 50 works from a list of codes to validate, and during each navigation evolution, determines the appropriate workflow for each code. Some codes will require a re-run of the evolution. For example, if the code is only applicable for a specific product, the driver 50 will need to restart the evolution, using the required product as part of the exploration. The overall system in which the driver operates continuously collects information that is evaluated for further runs. Some codes will be batched together, some will be validated individually, with specific environment settings and test data. The driver 50 can, for example, cycle through a plurality of promotion codes in the queue. For each promotion code, the driver 50 can enter the particular promotion code in the input box and then submit the promotion code to the promotion code provider. Some promotion code providers may require additional text or inputs in order for a promotion code to be validated. For instance, an online merchant's website may require the selection of a product for purchase or the clicking of a check box to indicate agreement with certain terms.

Referring again to FIG. 1, the system according to the invention evaluates a response 30 from the promotion code provider 60. For example, after receiving a response from the website, the driver 50 compares the pre-send state to the post-send state and looks for any new or changed elements that have keywords associated with validation responses. Any elements are captured as a response and are then analyzed to determine the end status of the evaluation. The possible response results vary across online merchants and are dependent on the promotion code rules implemented by such merchants. A typical result can be "The promotional code you entered is not valid" or "The promotional code you entered has expired." To evaluate the validity of a promotion code, the driver 50 uses a set of known words within the response result. For example, a response result that includes the word "expired" may be deemed to indicate an expired promotion code.

Figure 5:
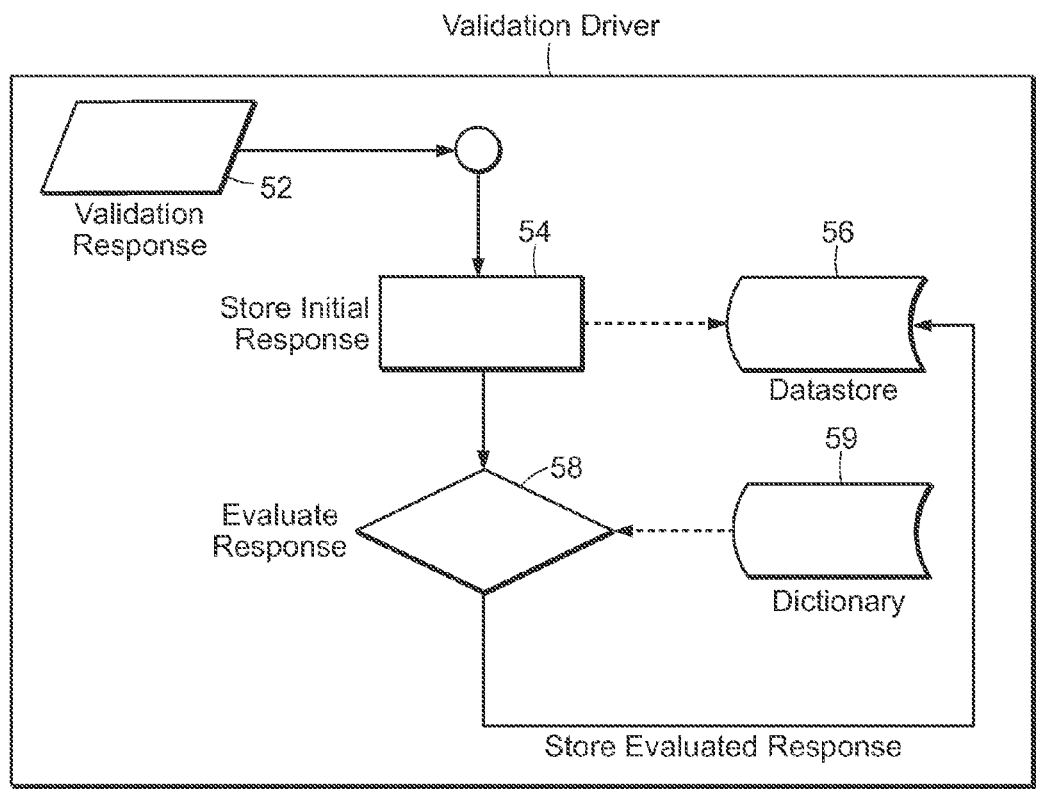
FIG. 5 illustrates one feature of one of the drivers 50 of FIG. 4.

FIG. 5 illustrates one feature of one of the drivers 50 of FIG. 4, also known as validation drivers. More particularly, FIG. 5 shows the modules used by the driver 50 in one embodiment to evaluate a response received from a promotion code provider 60 after a promotion code has been submitted. Upon receiving a validation response 52 from the promotion code provider 60, the driver 50 can initially store 54 the response in a buffer or memory 56. Next, the response can be evaluated 58 using a dictionary 59. The dictionary 59 can be built using machine learning to decipher responses from promotion code providers 60. For example, promotion code providers 60 may use a variety of responses to indicate that a promotion code is invalid. The data store 56 of FIG. 5 can be used to store evaluated responses.

As one example of the evaluation of a response 30 from the promotion code provider 60, the response from the promotion code provider 60 may read, "The promotional code you entered is not valid." The validation driver must parse this response and interpret what in means—in this case, the proper interpretation is simply that the promotion code is not valid. In another example, the response from the promotion code provider 60 may read, "Error 555." The validation driver may interpret this response to mean, for example, that the promotion code is not valid. In yet another example, the response from the promotion code provider 60 may read, "The promotional code you entered has expired." The validation driver should interpret this response to mean that the promotion code was once valid, but has now expired. The validation algorithm uses natural language processing to score and weight a response from a provider. There are trigger words such as invalid, or not applicable, within the responses, that will indicate the validity of a promotion code. However, some of these mappings between response and validity may result in a new workflow. For example, if the validation algorithm detects that a coupon might be valid, given the right shopping cart contents, it will search for product descriptions that might lead to the coupon becoming valid. The goal of the system is to validate the coupon or offer, so attempting to find ways, such as selecting appropriate shopping cart contents is a valid course of action for the algorithm.

Thus, improved techniques for validating a promotion code have been described. The use of the method and apparatus can, for example, allow a large number of promotion codes to be validated in an efficient and timely manner that saves shoppers from having to go through a series of manual steps to determine whether a promotion code is valid.

Although the invention has been described and illustrated in the foregoing illustrative embodiments, it is understood that the present disclosure has been made only by way of example, and that numerous changes in the details of implementation of the invention can be made without departing from the spirit and scope of the invention. Features of the disclosed embodiments can be combined and rearranged in various ways.

We claim:

1. A computerized method comprising:
traversing, by one or more computers, a promotion code provider website to obtain a promotion code validation page by processing markup language of the website to programmatically detect controls that provide site navigation and by which the website is traversed, wherein traversing comprises:
determining an exit path from each of a plurality of exit elements of the promotion code provider website based on an end state, wherein at least some of the exit paths comprise a plurality of node webpages within the promotion code provider website and at least some of the end states comprise one of a promotion code entry webpage, a webpage with no exit paths, or an exit path to a previously traversed webpage;
wherein at least some of the exit elements comprise a hyperlink, and wherein traversing the promotion code provider website comprises exploring the promotion code provider website by automatically determining which elements in webpages of the website lead to other webpages and automatically engaging the determined elements to navigate through the promotion code provider website;
assigning scores to each edge in the exit paths based on the respective end state, wherein each edge is a relationship between two node webpages formed by an exit element; and
identifying a path through a plurality of webpages of the promotion code provider website to the promotion code validation page based on the assigned scores;
providing, by one or more computers, the promotion code to a validation function of the promotion code provider via the identified promotion code validation page;
evaluating, by one or more computers, a response from the promotion code provider; and
identifying, by one or more computers, the promotion code as valid or invalid based on the evaluation.

2. The method of claim 1, wherein traversing the promotion code provider website to identify a promotion code validation page includes controlling an in-memory web browser through an application programming interface, wherein the application programming interface provides a set of functions for simulating user actions.

3. The method of claim 1, wherein providing a promotion code to a validation function of the promotion code provider via the identified promotion code validation page comprises automatically entering the promotion code in a promotion entry box of the promotion code validation webpage.

4. The method of claim 1, wherein evaluating a response from the promotion code provider includes determining whether the promotion code has expired.

5. The method of claim 1, wherein evaluating the response from the promotion code provider comprises identifying the words in the response by using a dictionary.

6. The computerized method of claim 1, wherein the traversing comprises:
determining an entry point at a webpage of the promotion code provider website; and
enumerating the plurality of exit elements from the webpage by programmatically obtaining elements of the webpage and interpreting which elements of the webpage have associated actions that cause a browser to leave the webpage, at least some of the exit elements being exit elements that lead to another webpage in the promotion code provider website.

7. The computerized method of claim 6, wherein exploring the promotion code provider website comprises recursively exploring the promotion code provider website.

8. The computerized method of claim 6, wherein the traversing further comprises identifying the end state as a promotion code entry webpage based on a proximity of an interaction element to an input element in the promotion code entry webpage.

9. The computerized method of claim 6, wherein an end state of a promotion code entry page has a different score from the other end states, and wherein assigning scores to each edge in the exit paths comprises:
adjusting scores of nodes in paths that lead to promotion code validation page based on a path length to the promotion code validation webpage.

10. The computerized method of claim 1, wherein the traversing comprises:
programmatically and systematically exploring a plurality of paths through the promotion code provider website, wherein:
the plurality of paths are obtained while and as a result of exploring the plurality of paths;
the plurality of paths are based on exit elements programmatically detected in webpages of the promotion code provider website by processing markup language of the respective webpages by detecting control elements in the markup language and determining how to move forward through the site via the identified control elements;
at least some of the paths include exit elements that both lead between webpages of the promotion code provider website and include an input box and an associated input control;
at least a plurality of the paths lead to a promotion code validation webpage; and
selecting a path to the promotion code validation webpage from among the plurality of paths that lead to the promotion code validation webpage based on an amount of webpages in the selected path being less than an amount of webpages in unselected paths.

11. The computerized method of claim 1, comprising:
sending online shoppers offers, at least one of the offers including the promotion code, and at least some of the offers being online coupons.

12. A non-transitory computer-readable memory embodying logic that is operable when executed to effectuate operations comprising:
traverse a promotion code provider website to obtain a promotion code validation page by processing markup language of the website to programmatically detect controls that provide site navigation and by which the website is traversed, wherein traversing the promotion code provider website to obtain a promotion code validation page comprises:
determining an exit path from each of a plurality of exit elements of the promotion code provider website based on an end state, wherein at least some of the exit paths comprise a plurality of node webpages within the promotion code provider website and at least some of the end states comprise one of a promotion code entry webpage, a webpage with no exit paths, or an exit path to a previously traversed webpage;
wherein at least some of the exit elements comprise a hyperlink, and wherein traversing the promotion code provider website comprises exploring the promotion code provider website by automatically determining which elements in webpages of the website lead to other webpages and automatically engaging the determined elements to navigate through the promotion code provider website;
assigning scores to each edge in the exit paths based on the respective end state, wherein each edge is a relationship between two node webpages formed by an exit element; and
identifying a path through a plurality of webpages of the promotion code provider website to the promotion code validation page based on the assigned scores;

provide the promotion code to a validation function of the promotion code provider using the computer system through a computer network via the identified promotion code validation page;
evaluate a response from the promotion code provider using the computer system; and
identify the promotion code as valid or invalid based on the evaluation.

13. The computer-readable storage media of claim 12, wherein the logic operable when executed to traverse the promotion code provider website to identify a promotion code validation page includes logic operable when executed to control an in-memory web browser through an application programming interface, wherein the application programming interface provides a set of functions for simulating user actions.

14. The computer-readable storage media of claim 12, wherein the logic is further operable when executed to provide a promotion code to a validation function of the promotion code provider via the identified promotion code validation page comprises automatically entering the promotion code in a promotion entry box of the promotion code validation webpage.

15. The computer-readable storage media of claim 12, wherein the logic operable when executed to evaluate a response from the promotion code provider includes logic operable when executed to determine whether the promotion code has expired.

16. The computer-readable storage media of claim 12, wherein the logic operable when executed to evaluate the response from the promotion code provider includes logic operable when executed to identify the words in the response by using a dictionary.

17. An apparatus comprising:
at least one driver module in memory, wherein the driver module is operable to traverse a promotion code provider website to obtain a promotion code validation page by processing markup language of the website to programmatically detect controls that provide site navigation and by which the website is traversed, wherein traversing the promotion code provider website to obtain a promotion code validation page comprises:
determining an exit path from each of a plurality of exit elements of the promotion code provider website based on an end state, wherein at least some of the exit paths comprise a plurality of node webpages within the promotion code provider website and at least some of the end states comprise one of a promotion code entry webpage, a webpage with no exit paths, or an exit path to a previously traversed webpage;
wherein at least some of the exit elements comprise a hyperlink, and wherein traversing the promotion code provider website comprises exploring the promotion code provider website by automatically determining which elements in webpages of the website lead to other webpages and automatically engaging the determined elements to navigate through the promotion code provider website;
assigning scores to each edge in the exit paths based on the respective end state, wherein each edge is a relationship between two node webpages formed by an exit element; and
identifying a path through a plurality of webpages of the promotion code provider website to the promotion code validation page based on the assigned scores;

a monitor in memory to manage the at least one driver;
wherein the driver module contains logic in memory that is operable when executed to effectuate operations comprising:
provide the promotion code to a validation function of the promotion code provider via the identified promotion code validation page;
evaluate a response from the promotion code provider; and
identify the promotion code as valid or invalid based on the evaluation.

18. The apparatus of claim 17, wherein the interface is an application programming interface including a set of functions for simulating user actions.

19. The apparatus of claim 17, wherein the monitor is operable to dynamically scale a number of driver modules instantiated.

\* \* \* \* \*